United States Patent
Watanabe et al.

(10) Patent No.: US 12,374,732 B2
(45) Date of Patent: Jul. 29, 2025

(54) METHOD, DEVICE, PROGRAM, AND RECORDING MEDIUM FOR ESTIMATING INTERNAL TEMPERATURE OF SECONDARY BATTERY

(71) Applicants: FURUKAWA ELECTRIC CO., LTD., Tokyo (JP); FURUKAWA AUTOMOTIVE SYSTEMS INC., Shiga (JP)

(72) Inventors: Yoshitaka Watanabe, Tokyo (JP); Shinji Yokoyama, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 531 days.

(21) Appl. No.: 17/932,821

(22) Filed: Sep. 16, 2022

(65) Prior Publication Data

US 2023/0020597 A1    Jan. 19, 2023

Related U.S. Application Data

(63) Continuation of application No. PCT/JP2021/007814, filed on Mar. 2, 2021.

(30) Foreign Application Priority Data

Mar. 26, 2020    (JP) .................. 2020-056679

(51) Int. Cl.
*H01M 10/48* (2006.01)
*B60L 58/10* (2019.01)
(Continued)

(52) U.S. Cl.
CPC .......... *H01M 10/486* (2013.01); *B60L 58/10* (2019.02); *G01R 31/3842* (2019.01); *G01R 31/389* (2019.01)

(58) Field of Classification Search
CPC .......... B60L 2240/36; B60L 2240/545; B60L 2240/547; B60L 2240/549; B60L 58/10;
(Continued)

(56) References Cited

U.S. PATENT DOCUMENTS

| | | |
|---|---|---|
| 2007/0120537 A1 | 5/2007 | Yamamoto |
| 2014/0095092 A1 | 4/2014 | Ikeda et al. |
| 2015/0331059 A1 | 11/2015 | Okada et al. |

FOREIGN PATENT DOCUMENTS

| | | |
|---|---|---|
| JP | 2007157348 A | 6/2007 |
| JP | 2013101884 A | 5/2013 |

(Continued)

OTHER PUBLICATIONS

International Search Report and Written Opinion (English Translation for ISR only) dated May 18, 2021 for International Patent Application No. PCT/JP2021/007814, pp. all.

*Primary Examiner* — Victoria H Lynch
(74) *Attorney, Agent, or Firm* — Dorsey & Whitney LLP

(57) ABSTRACT

Methods and apparatuses for accurately estimating an internal temperature of a secondary battery with a charging rate SOC and a charge/discharge state taken into account are provided. A method may include a method of estimating an internal temperature (T) of a secondary battery for a vehicle, which includes a change determination process to be repeatedly performed and an internal temperature estimation process to be repeatedly performed.

5 Claims, 6 Drawing Sheets

(51) Int. Cl.
*G01R 31/3842* (2019.01)
*G01R 31/389* (2019.01)

(58) Field of Classification Search
CPC ... B60L 58/12; G01R 31/3842; G01R 31/389; H01M 10/48; H01M 10/486; H01M 2220/20; Y02E 60/10; Y02T 10/70
See application file for complete search history.

(56) References Cited

FOREIGN PATENT DOCUMENTS

| | | |
|---|---|---|
| JP | 2014070982 A | 4/2014 |
| WO | 2014118911 A1 | 8/2014 |

ND PROGRAM, AND
RECORDING MEDIUM FOR ESTIMATING
INTERNAL TEMPERATURE OF
SECONDARY BATTERY

The present application is a continuation application of International Patent Application No. PCT/JP2021/007814 filed on Mar. 2, 2021, which claims the benefit of Japanese Patent Application No. 2020-056679, filed on Mar. 26, 2020. The contents of these applications are incorporated herein by reference in their entirety.

BACKGROUND

Technical Field

The present invention relates to a method, a device, and a program for estimating an internal temperature of a secondary battery and a recording medium in which the program is stored and particularly relates to a method and the like for estimating an internal temperature of a secondary battery installed in a vehicle.

Background

A secondary battery has characteristics significantly changeable with an internal temperature; for example, an optimal charging rate differs depending on the internal temperature and a performance is deteriorated when the internal temperature exceeds a certain level. Accordingly, internal temperature management is important.

However, since it is difficult to install a sensor that directly measures an internal temperature in a vehicle, a method of estimating an internal temperature with a rise in temperature due to Joule heat taken into account from an internal resistance of a secondary battery is proposed as described in Japanese Patent Application Publication No. 2007-157348. According to Japanese Patent Application Publication No. 2007-157348, an internal resistance DCIRnml at a reference time is identified from a correlation between a battery temperature based on measurement during discharge and the internal resistance, an internal resistance DCIR is determined by multiplication by a correction factor F taking into account time elapsed from the start of discharge, and Joule heat HGjoule is determined from the internal resistance DCIR.

SUMMARY

An internal resistance significantly changes depending on not only time elapsed since the start of discharge but also a charging rate of a secondary battery. Further, a relationship between the charging rate and the internal resistance also differs depending on whether the secondary battery is being charged or discharged. In particular, in a high charging rate region that is almost fully charged and a low charging rate region that is almost completely discharged, a magnitude of the internal resistance relative to the charging rate significantly differs between when it is being charged and when it is being discharged. Accordingly, in a case where an internal temperature (liquid temperature) is estimated from the internal resistance determined without taking into account the charging rate and a charge/discharge state of the secondary battery, a decrease in accuracy is of concern.

This leads to a demand for a method, a device, and a program for accurately estimating an internal temperature of a secondary battery with a charging rate and a charge/discharge state taken into account and for a recording medium in which the program is stored.

According to a first aspect of the present disclosure, the above problem can be solved by a method of estimating an internal temperature (T) of a secondary battery for a vehicle, the method including a change determination process to be repeatedly performed and an internal temperature estimation process to be repeatedly performed, the change determination process including: a step of determining a first change in internal resistance (R) relative to a charging rate (SOC) of the secondary battery based on a voltage (V) and a charge/discharge current (I) of the secondary battery when the vehicle is stopped or starts moving; and a step of determining a second change in internal resistance (R) relative to the charging rate (SOC) of the secondary battery based on the voltage (V) and the charge/discharge current (I) of the secondary battery when the vehicle is moving, the internal temperature estimation process including: a step of measuring an external temperature (To) of the secondary battery; a step of measuring the charge/discharge current (I) of the secondary battery; a step of determining the charging rate (SOC) of the secondary battery; a step of determining whether or not the secondary battery is being discharged; a step of selecting the first change in a case where the secondary battery is being discharged; a step of selecting the second change in a case where the secondary battery is not being discharged; a step of determining an internal resistance (R) of the secondary battery based on the selected change and the determined charging rate; and a step of estimating the internal temperature (T) of the secondary battery based on the external temperature (To), the measured charge/discharge current (I), and the internal resistance (R).

In other words, two changes, a change (the first change) in internal resistance relative to the charging rate when the secondary battery is being discharged and a change (the second change) in internal resistance relative to the charging rate when it is being charged, are prepared and the first change is determined when the vehicle is stopped or starts moving with discharge being mainly performed, whereas the second change is determined when the vehicle is being moved with charge being mainly performed. Then, a highly accurate internal resistance is determined based on the change selected in accordance with a charge/discharge state of the secondary battery and the internal temperature is estimated by using the internal resistance, whereby a highly accurate estimation of the internal temperature can be performed.

It should be noted that "being stopped" according to the invention of the present application refers to a state where charge/discharge of the secondary battery is not performed, such as an ignition-off state. Accordingly, for a vehicle including an internal combustion engine (a hybrid car or the like), an idling state (a state where an internal combustion engine operates while the vehicle does not move) is not within "being stopped."

Here, it is desirable that the method further includes a step of determining whether or not the determined charging rate (SOC) falls within a predetermined range and the step of determining the internal resistance (R) includes determining, in response to the determined charging rate (SOC) falling within the predetermined range, the internal resistance (R) of the secondary battery based on the change selected and the charging rate (SOC) determined during a previous repetition. With the charging rate being within a middle region (the predetermined range), a change in internal resistance relative to the charging rate less differs depending on the charge/discharge state and, accordingly, the change selected during the previous repetition is still used to determine the internal resistance (R), which enables simplifying the estimation process without impairing the accuracy of estimation.

Alternatively, it is desirable that the method further includes: a step of determining whether or not the determined charging rate (SOC) falls within a predetermined range; and a step of selecting, in response to the determined charging rate (SOC) falling within the predetermined range, the first change irrespective of whether or not the secondary battery is being discharged. With the charging rate being within a middle region (the predetermined range), a change in internal resistance relative to the charging rate less differs depending on the charge/discharge state and, accordingly, the first change is always selected irrespective of whether or not the secondary battery is being discharged, which eliminates the necessity of a process to determine whether or not the secondary battery is being discharged for selection and enables simplifying the estimation process without impairing the accuracy of estimation.

In addition, it is desirable that the method further includes a step of correcting the determined internal resistance (R) based on the internal temperature (T) estimated during a previous repetition. By virtue of using the internal resistance (R) corrected based on the internal temperature (T) estimated during the previous repetition to determine the new internal temperature (T), it is possible to prevent estimation results from being discontinuous and avoid a sudden change in estimated internal temperature. Further, the above problem can be solved by a device and a program that implement the above-described method and a recording medium in which the program is stored.

DETAILED DESCRIPTION

Figure 4:
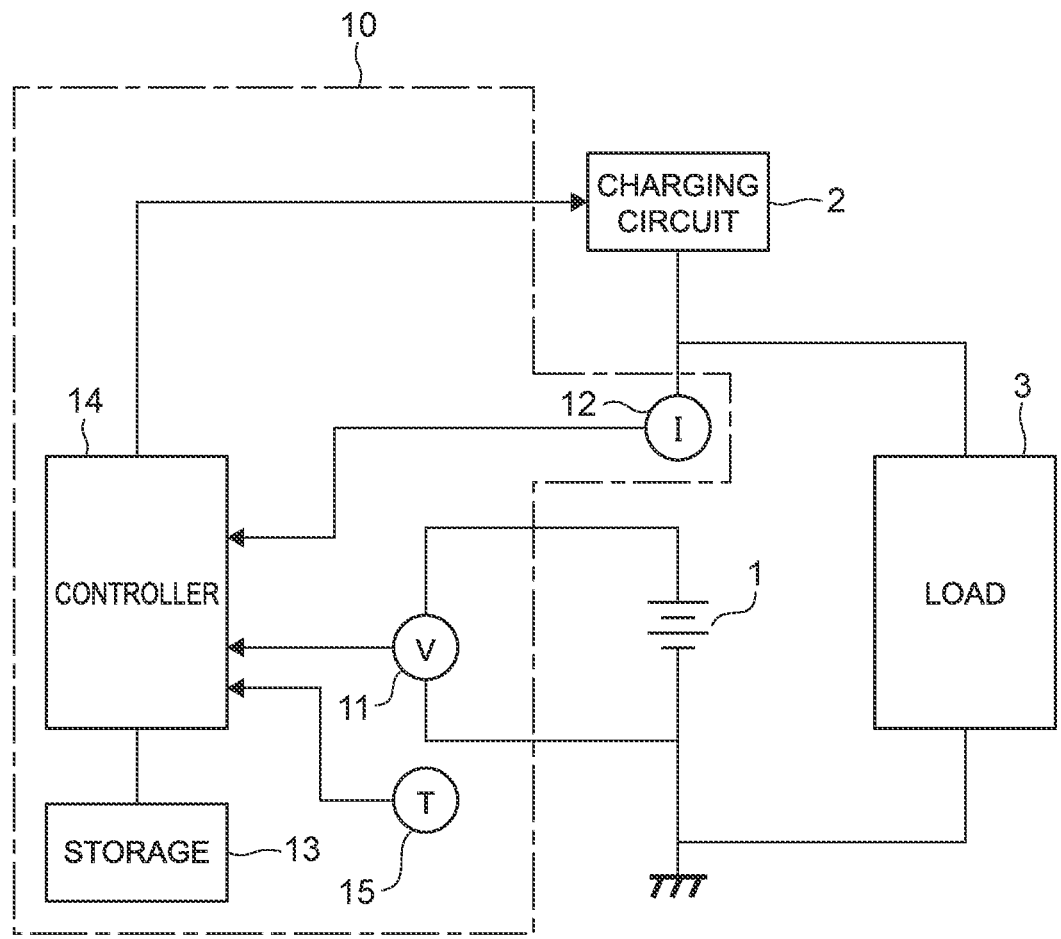
FIG. 4 is a schematic configuration diagram of an internal temperature estimation device according to the present invention.

FIG. 4 illustrates a schematic configuration diagram of an embodiment of the present invention, or internal temperature estimation device 10. The internal temperature estimation device 10 is connected to a secondary battery 1 and a charging circuit 2. The secondary battery 1 is, for example, a lead storage battery for a vehicle. The charging circuit 2 is a power circuit that is to be connected to the secondary battery 1 to supply a charge current. The secondary battery 1 is also connected to a load 3, for example in-vehicle electric equipment such as a motor, a control circuit, and an illumination device. The secondary battery 1, the charging circuit 2, the load 3, and the internal temperature estimation device 10 are installed in a vehicle (not illustrated).

The internal temperature estimation device 10 includes a voltage sensor 11, a current sensor 12, a temperature sensor 15, a storage 13, and a controller 14. The voltage sensor 11, the current sensor 12, the temperature sensor 15, and the storage 13, which are electrically connected to the controller 14, are capable of data or signal communication with each other.

The voltage sensor 11, which is connected between terminals of the secondary battery 1, measures an interterminal voltage periodically and/or in response to a requirement from the controller 14 and sends a measured voltage V to the controller 14. The current sensor 12, which is connected between the secondary battery 1 and the charging circuit 2 such that the secondary battery 1 and the current sensor 12 and the load 3 are connected in parallel, measures a charge/discharge current I flowing through the secondary battery 1, i.e., a charge current flowing into the secondary battery 1 and a discharge current flowing out of the secondary battery 1, periodically and/or in response to a requirement from the controller 14 and sends the measured charge/discharge current I to the controller 14. Further, the temperature sensor 15, which is disposed in the secondary battery 1 or in the vicinity thereof, measures an external temperature To of the secondary battery 1 periodically and/or in response to a requirement from the controller 14 and sends the measured temperature To to the controller 14.

The controller 14, which includes a processor, acquires a measurement signal and measurement data from the voltage sensor 11, the current sensor 12, and the temperature sensor 15 and performs and controls processing for estimating an internal temperature T of the secondary battery 1. The controller 14 is also capable of communication with the charging circuit 2 and can perform a control to cause a charge/discharge current with a predetermined pattern to flow from the charging circuit 2 to the secondary battery 1. Further, the controller 14 may be configured to control a timing for the voltage sensor 11, the current sensor 12, and the temperature sensor 15 to perform measurement.

Figure 5:
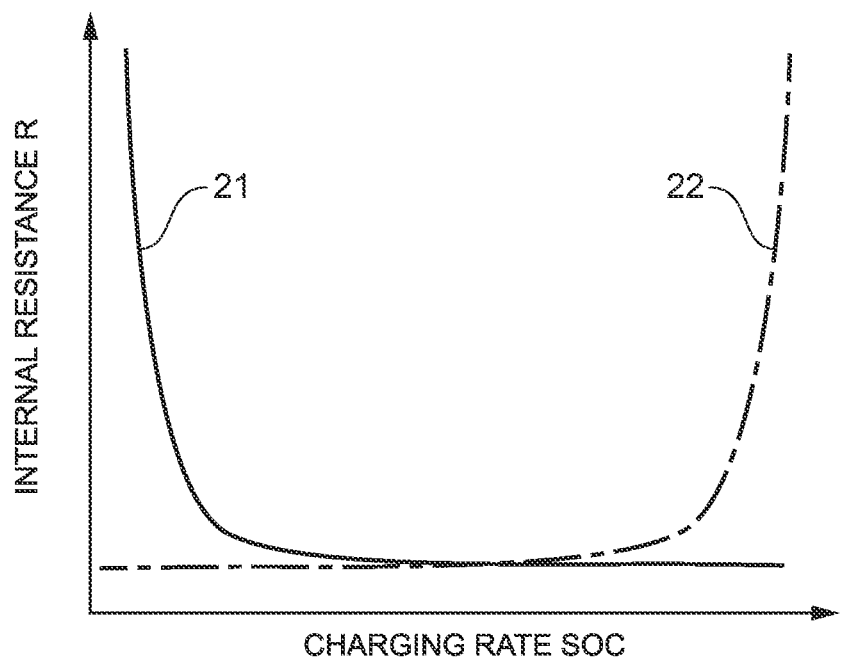
FIG. 5 is a diagram illustrating changes in internal resistance relative to charging rates during charge and during discharge.

The storage 13 includes a computer readable recording medium including a semiconductor memory such as RAM, SSD, or flash memory or a magnetic memory such as an HDD. The storage 13 stores a program to be executed by the processor of the controller 14, various parameters usable during a processing process of the program, two changes 21, 22 in internal resistance R relative to a charging rate SOC, measurement values acquired from the voltage sensor 11, the current sensor 12 and the temperature sensor 15 by the controller 14, the estimated internal resistance R and internal temperature T, and the like. FIG. 5 illustrates an example of the changes 21, 22.

FIG. 5 is a graph, in which an abscissa axis represents the charging rate SOC of the secondary battery 1 and an ordinate axis represents the internal resistance R of the secondary battery 1, illustrating the first change 21 in the internal resistance R relative to the charging rate SOC when the vehicle is stopped or starts moving with the secondary battery 1 being mainly in a discharge state and the second change 22 in the internal resistance R relative to the charging rate SOC when the vehicle is moving with the secondary battery 1 being mainly in a charge state. With the changes 21, 22 stored in the form of table, approximate expression, or the like in the storage 13, the controller 14 can determine the changes 21, 22 by generating/updating the table, a coefficient of the approximate expression, or the like stored or read the selected changes 21, 22, and use the changes 21, 22 to estimate the internal resistance R and the internal temperature T of the secondary battery 1.

Figure 1A:
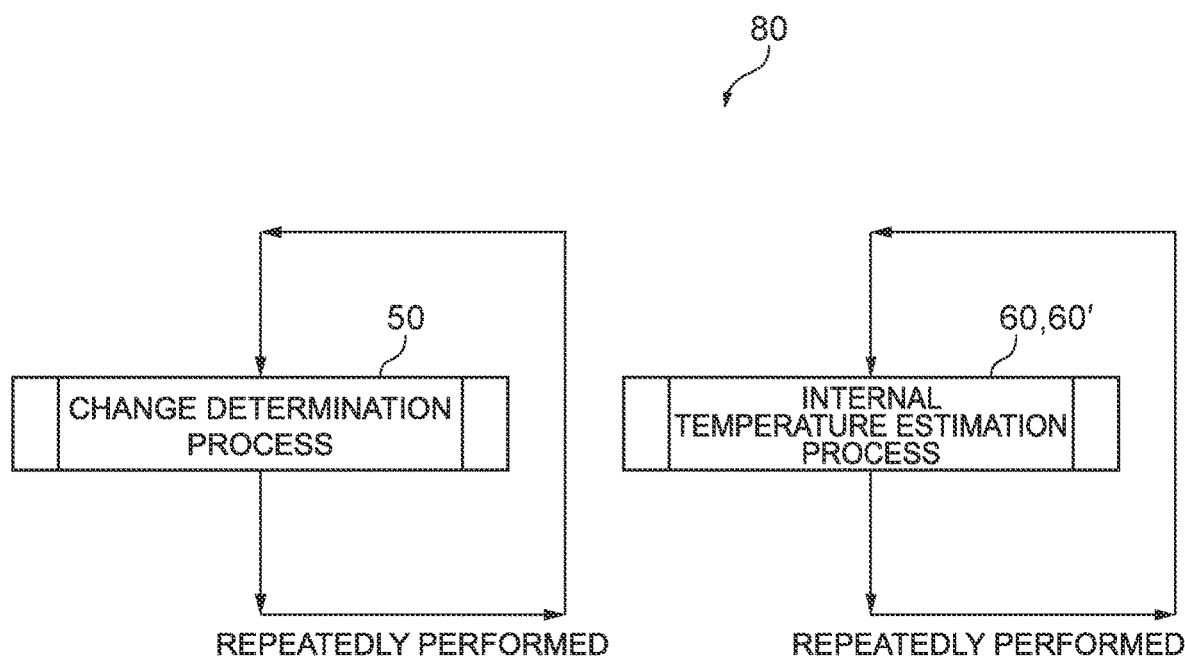
FIG. 1A and FIG. 1B are flowcharts of internal temperature estimation method and program according to the present invention.
Figure 1B:
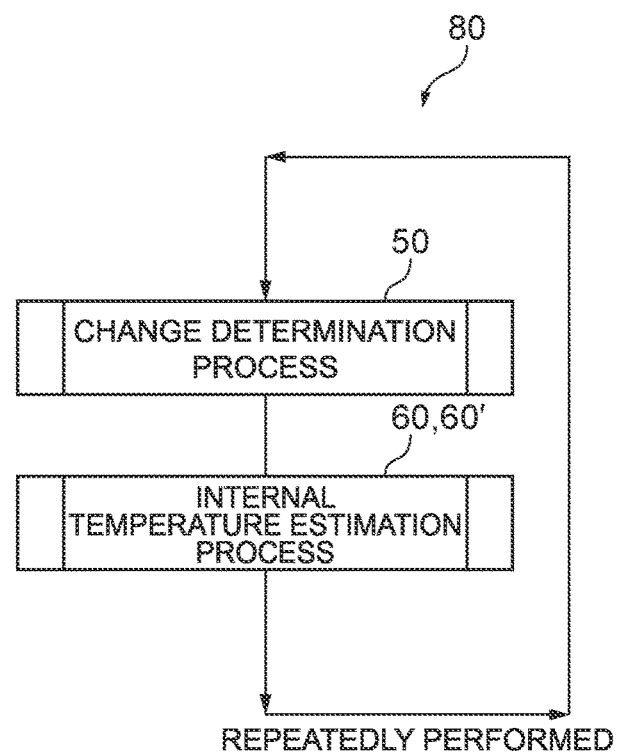
Figure 2:
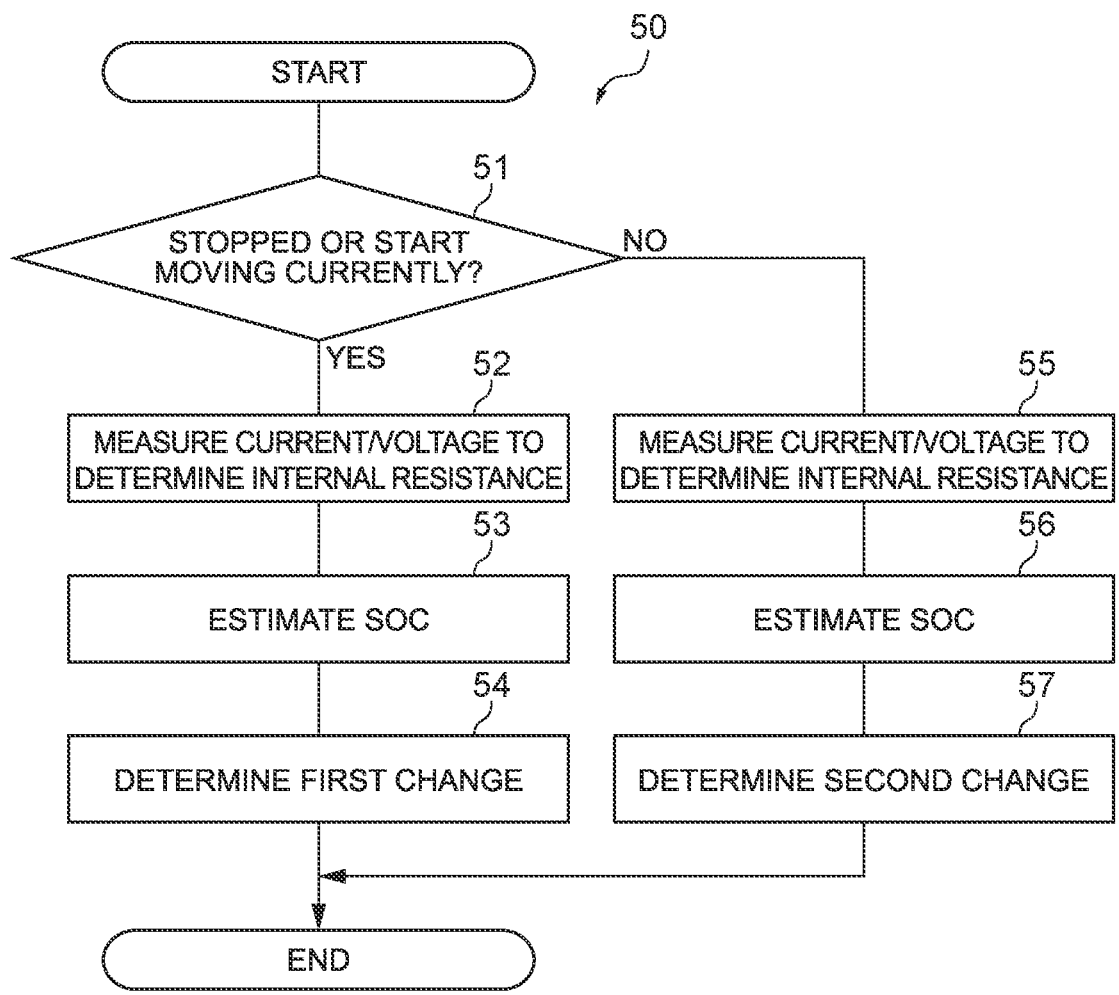
FIG. 2 is a flowchart of a change determination process.

Thereafter, an embodiment according to the present invention, or estimation method 80 of an internal temperature of a secondary battery, will be described with reference to flowcharts 50, 60, 60', 80 in FIGS. 1 to 3. The estimation method 80 of an internal temperature of a secondary battery includes two processes: a change determination process illustrated in the flowchart 50 in FIG. 2 and internal temperature estimation processes illustrated in the flowcharts 60, 60' in FIG. 3A and FIG. 3B. The change determination process 50 is a processing process to determine the first change 21 when the vehicle is stopped or starts moving (i.e., when the secondary battery 1 is mainly in the discharge state) and the second change 22 when the vehicle is moving (i.e., when the secondary battery 1 is mainly in the charge state). In addition, the internal temperature estimation processes 60, 60' are processing processes to estimate the internal temperature T of the secondary battery 1 by using the determined changes 21, 22.

The two processes 50, 60 (or 50, 60') are both repeatedly performed periodically or aperiodically in response to a requirement. Regarding timings of performing the two processes 50, 60 (or 50, 60'), the processes 50, 60 (or 50, 60') may be each independently performed as in FIG. 1A or may be repeatedly performed in sequence as in FIG. 1B. A program for causing the processor of the controller 14 to perform functions illustrated in the flowcharts 50, 60, 60', 80 is stored in the storage 13 of the internal temperature estimation device 10.

Thereafter, description will be made on the change determination process 50 with reference to the flowchart 50 in FIG. 2. First, the controller 14 determines whether or not the vehicle is stopped or starts moving currently (Step 51). In a case where the vehicle is stopped or starts moving currently, the charge/discharge current of the secondary battery 1 is supposed to be small and, accordingly, the controller 14 controls the charging circuit 2 to cause a discharge current with a predetermined discharge pattern to flow from the secondary battery 1. The discharge pattern corresponds to, for example, a pulse discharge. At this time, the voltage sensor 11 measures the interterminal voltage V of the secondary battery 1 and the current sensor 12 measures the discharge current I flowing out of the secondary battery 1. In addition, the internal resistance R can be determined by dividing the measured voltage V by the current I (R=V/I) (Step 52). Since the measurement is performed when the vehicle is stopped or starts moving, measurement results of voltage and current in a stable state can be obtained and the highly accurate internal resistance R can be determined.

Thereafter, the controller 14 determines the charging rate SOC of the secondary battery 1 (Step 53). Various methods are available as the charging rate estimation method; for example, the charge/discharge current I at the time when and after the secondary battery 1 is fully charged (SOC=100%) is repeatedly measured by the current sensor 12 and integrated at a measurement time interval Δt to determine an amount of change ΔQ of the quantity of electricity at the time when and after it is fully charged (ΔQ=time integration of (I*Δt)), the amount of change ΔQ is divided by a full charge capacity SOH of the secondary battery 1 to determine an amount of change ΔSOC of the charging rate (ΔSOC=ΔQ/SOH/100), and a current SOC can be estimated as a difference from a full charge state (SOC=100%) (SOC=100−ΔSOC). An initial state of time integration is not limited to time when full charge is achieved and the current charging rate SOC may be estimated by determining a charging rate SOCo at any time point and estimating the amount of change ΔQ of the quantity of electricity from the time point (SOC=SOCo−ΔSOC).

Thereafter, the first change 21 in the internal resistance (R) relative to the charging rate (SOC) of the secondary battery (1) is determined from the estimated charging rate SOC and the determined internal resistance R (Step 54). Specifically, for example, the estimated charging rate SOC and the determined internal resistance R are added to or updated in the table of the first change 21 stored in the storage 13. Alternatively, an approximate expression representing a change in the internal resistance R relative to the charging rate SOC may be updated from the estimated current charging rate SOC and the determined internal resistance R. In a case where the amount of data regarding the first change 21 stored in the storage 13 is small and a correlation between the charging rate (SOC) and the internal resistance (R) is not sufficiently determined, the first change 21 may be generated by repeating the change determination process 50 and collecting a relationship between the charging rate SOC and the internal resistance R. In the present invention, "determining a change" includes both of newly generating a change (table, approximate expression, or the like) in the internal resistance R relative to the charging rate SOC and updating an existing change.

In contrast, in a case where it is determined that the vehicle is neither stopped nor starts moving currently in Step 51, the charge/discharge current is supposed to be large, since the vehicle is moving. Accordingly, the voltage sensor 11 measures the interterminal voltage V of the secondary battery 1 and the current sensor 12 measures the discharge current I flowing out of the secondary battery 1 (Step 55). More specifically, the controller 14 requires the voltage sensor 11 to measure the interterminal voltage of the secondary battery 1 and acquires the voltage V measured by the voltage sensor 11, or acquires the latest voltage V periodically measured by the voltage sensor 11 from the storage 13. The controller 14 also requires the current sensor 12 to measure the charge/discharge current I of the secondary battery 1 and acquires a magnitude of the current I measured by the current sensor 12, or acquires the latest magnitude of the current I periodically measured by the current sensor 12 from the storage 13. The internal resistance R can be determined by dividing the measured voltage V by the current I (R=V/I) (Step 55).

Thereafter, the controller 14 determines the charging rate SOC of the secondary battery 1 (Step 56). An example of a specific method for estimating the charging rate SOC is described in the explanation of Step 53 and omitted, accordingly. The estimation in Step 56 may be performed by a method similar to that of the estimation in Step 53 or a different method.

Thereafter, the second change 22 of the internal resistance (R) relative to the charging rate (SOC) of the secondary battery (1) is determined from the estimated current charging rate SOC and the determined internal resistance R (Step 57). Specifically, for example, the estimated charging rate SOC and the determined internal resistance R are added to or updated in the table of the second change 22 stored in the storage 13. Alternatively, an approximate expression representing a change in the internal resistance R relative to the charging rate SOC may be updated from the estimated current charging rate SOC and the determined internal resistance R. In a case where the amount of data regarding the second change 22 stored in the storage 13 is small and a correlation between the charging rate (SOC) and the internal resistance (R) is not sufficiently determined, the second change 22 may be generated by repeating the change determination process 50 and collecting a relationship between the charging rate SOC and the internal resistance R. Meanwhile, since Steps 55 to 57 are performed when the vehicle is moving, a variation in measurement result is likely to be increased due to instability of the voltage of the secondary battery 1. Accordingly, data is repeatedly acquired to determine a change even in a region where a correlation between the charging rate SOC and the internal resistance R is already found, which makes it possible to determine the highly accurate change 22.

By virtue of the change determination process 50 described hereinabove, it is possible to determine the first change 21 in the internal resistance R relative to the charging rate SOC of the secondary battery 1 when the vehicle is stopped or starts moving and the second change 22 in the internal resistance R relative to the charging rate SOC of the secondary battery 1 when the vehicle is moving.

Thereafter, description will be made on the internal temperature estimation processes 60, 60' with reference to the flowcharts 60, 60' in FIG. 3A, FIG. 3B. The internal temperature estimation process 60 and the internal temperature estimation process 60' are different only in presence/absence of Step 73; therefore, description will be made based on the flowchart 60 in FIG. 3A while a difference from the flowchart 60' in FIG. 3B will be described, if necessary. When the vehicle is stopped or starts moving, the charge/discharge current is small and a rise in temperature due to Joule heat is small. For this reason, for estimation of the internal temperature T, processing contents differ in accordance with whether or not the vehicle is in a moving state. Accordingly, the controller 14 first determines whether or not ignition of the vehicle is in an ON state in order to determine whether or not the vehicle is moving (Step 61).

In a case where the ignition is not in the ON state, the controller 14 causes the temperature sensor 15 to measure the external temperature To of the secondary battery 1 (Step 62). More specifically, the controller 14 requires the temperature sensor 15, which is installed in the secondary battery 1 or in the vicinity thereof, to measure the external temperature of the secondary battery 1 and acquires the external temperature To measured by the temperature sensor 15, or acquires the latest external temperature To periodically measured by the temperature sensor 15 from the storage 13. The controller 14 then estimates the internal temperature T based on the measured external temperature To (Step 71). The above-described step is repeated until the ignition is turned into the ON state and thus the external temperature To reaches, at the end, the external temperature To at the time when the vehicle starts moving.

In contrast, in a case where the ignition is in the ON state, the controller 14 causes the current sensor 12 to measure the charge/discharge current I of the secondary battery 1 (Step 63). More specifically, the controller 14 requires the current sensor 12 to measure the charge/discharge current I of the secondary battery 1 and acquires a magnitude of the current I measured by the current sensor 12, or acquires a magnitude of the latest current I periodically measured by the current sensor 12.

Thereafter, the controller 14 determines the current charging rate SOC of the secondary battery 1 based on the measured charge/discharge current I (Step 64). Description on an example of a specific method for estimating the charging rate SOC is omitted as being given in the explanation of Step 53. The estimation in Step 64 may be performed by a method similar to that of the estimation in Step 53 or Step 56 or a different method.

Thereafter, the controller 14 determines whether or not the determined charging rate SOC falls within a predetermined range (Step 65). As is obvious from FIG. 5, a magnitude of the internal resistance R relative to the charging rate SOC significantly differs in a high charging rate region that is almost fully charged and a low charging rate region that is almost completely discharged, whereas a difference becomes small in a middle region therebetween. Accordingly, with the middle region defined between an upper threshold of the charging rate (for example, 80%) and a lower threshold (for example, 20%), it is determined whether or not the estimated charging rate SOC is within a predetermined range between the upper limit and the lower limit, i.e., in the middle region.

In a case where the charging rate SOC is out of the predetermined range, i.e., the charging rate SOC is in a region above the upper threshold that is almost fully charged or in a region below the lower threshold that is almost completely discharged, the magnitude of the internal resistance R relative to the charging rate SOC significantly differs depending on a charge/discharge state and thus estimation has to be performed by using a change conformable with the charge/discharge state. Accordingly, the controller 14 first determines whether or not the secondary battery 1 is being discharged (Step 66). In a case where it is being discharged, the controller 14 selects the first change 21 (Step 67). Otherwise, or in a case where it is not being discharged (in other words, it is being charged), the controller 14 selects the second change 22 (Step 68).

Afterward, the controller 14 determines the internal resistance R of the secondary battery 1 based on the selected change and the determined charging rate SOC (Step 69). Specifically, the controller 14 determines the internal resistance R corresponding to the determined charging rate SOC with reference to the selected change. By virtue of thus determining the internal resistance R without using the interterminal voltage of the secondary battery 1 when the vehicle is moving, which would be measured with a large variation, the accurate internal resistance R can be determined. The determined internal resistance R is corrected based on the internal temperature T estimated during a previous repetition (Step 72). For transition from a stopped state to a moving state of the vehicle, the internal resistance R determined in Step 69 is corrected based on the internal temperature T estimated in Step 71 in the stopped state. Further, the determined internal resistance R may be corrected in accordance with a change in external temperature measured by the temperature sensor 15 or the amount of change of the charging rate SOC. The internal resistance determined in Step 69 and internal resistance corrected in Step 72, which are stored in the storage 13, are usable for estimation of the internal temperature T and control of the vehicle or the secondary battery 1.

In contrast, in a case where the determined charging rate SOC is within the predetermined range, i.e., in a case where the estimated charging rate SOC is in the middle region between the upper threshold and the lower threshold, a difference in the magnitude of the internal resistance R relative to the charging rate SOC depending on the charge/discharge state is small and, accordingly, selection of the change is not newly performed. Thus, with the change selected during the previous repetition of the internal temperature estimation process 60 still kept, the internal resistance R is determined based on the change selected during the previous repetition and the charging rate (SOC) determined in Step 64. This allows Steps 66 to 68 to be skipped, enabling simplifying the process without impairing the accuracy of estimation, and reducing a processing load on the processor of the controller 14.

Lastly, the internal temperature T of the secondary battery 1 is estimated based on the external temperature To, the measured charge/discharge current I, and the determined internal resistance R (Step 70). More specifically, the amount of change (ΔT) of the internal temperature due to Joule heat can be determined by the following expression.

$$\Delta T = J * I^2 * t * R/Ro$$

where, t denotes time, Ro denotes a reference resistance, and J denotes a coefficient of a reference resistance Ro determined in advance for each battery size based on measurement values of the charge/discharge current and a battery temperature change.

ΔTs is reset to zero upon determination of the external temperature To when the vehicle starts moving and then, every time when Step 70 is performed, ΔT is determined and integrated in accordance with the time elapsed t since when Step 70 is previously performed, whereby the amount of change ΔTs of the internal temperature after the vehicle starts moving can be determined. Since the internal temperature T when the vehicle starts moving is considered to be equal to the external temperature To, the current internal temperature T can be determined by the following expression.

$$T = To + Ts$$

The estimated internal temperature T is stored in the storage 13 and can be used to control the vehicle or the secondary battery 1 as needed.

Figure 3A:
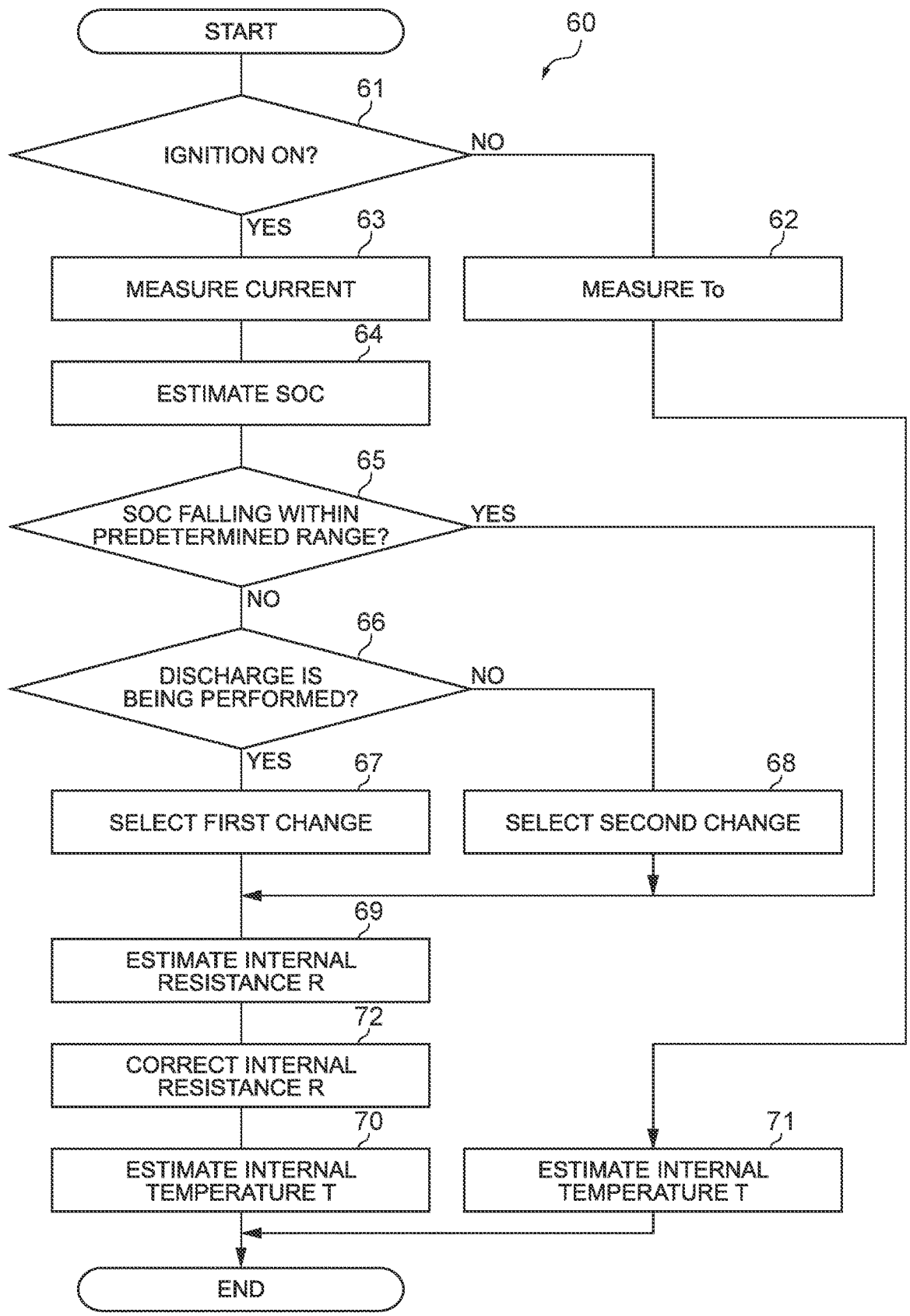
FIG. 3A is a flowchart of an internal temperature estimation process.
Figure 3B:
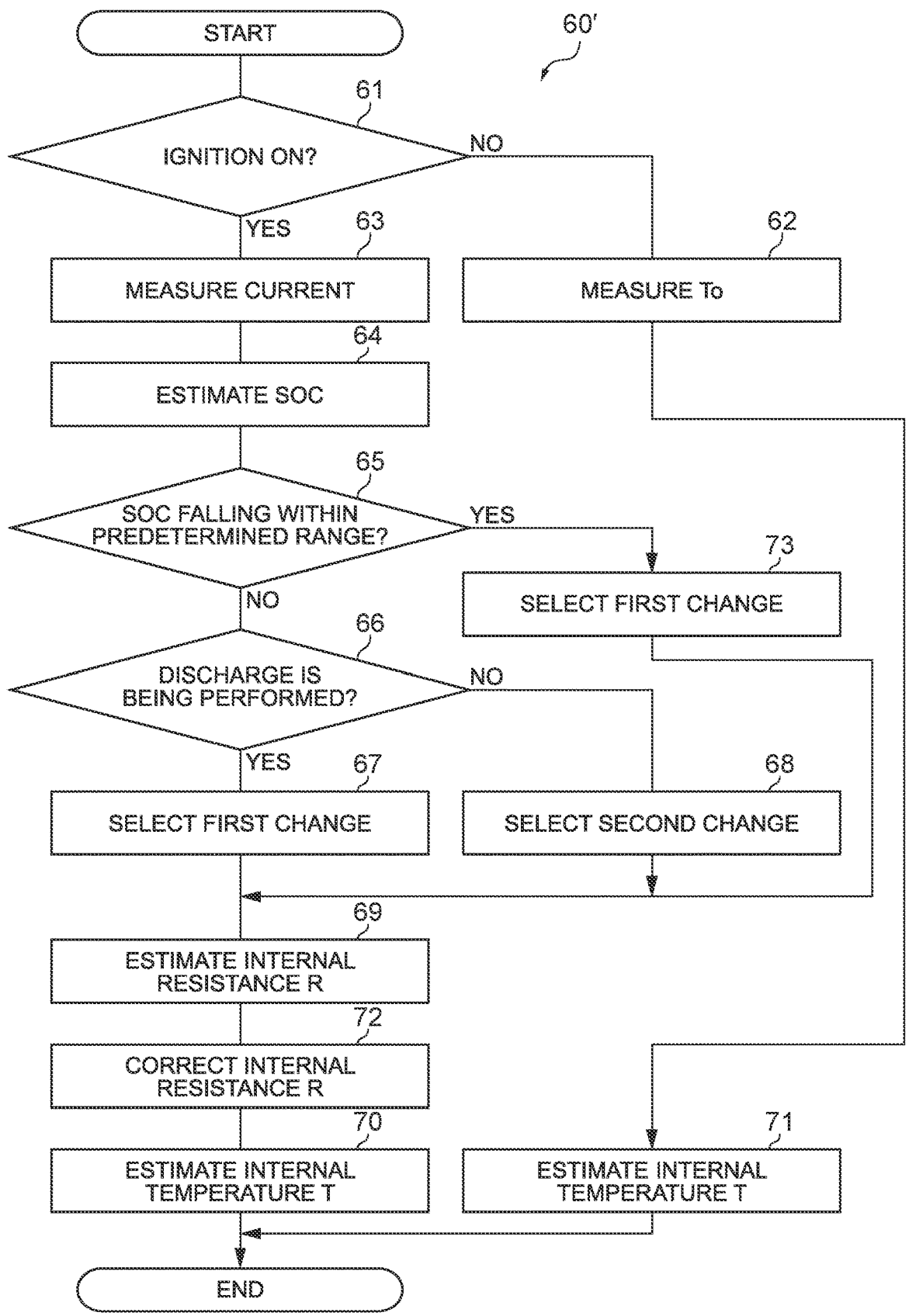
FIG. 3B is a flowchart of an internal temperature estimation process.

It should be noted that although in the internal temperature estimation process 60 illustrated in FIG. 3A, selection of the change is not newly performed in a case where the determined charging rate SOC is within the predetermined range, the controller 14 may alternatively select the first change 21 as long as the determined charging rate SOC is within the predetermined range irrespective of whether or not the secondary battery 1 is being discharged as in the internal temperature estimation process 60' illustrated in FIG. 3B (Step 73). This eliminates the necessity of the process to determine whether or not the secondary battery is being discharged for selection of the change as long as the charging rate is within the middle region (the predetermined range), enabling simplifying the process and reducing the processing load on the processor of the controller 14.

By virtue of the internal temperature estimation processes 60, 60' described hereinabove, the internal temperature T can be determined by using the change 21 in the internal resistance R relative to the charging rate SOC when the vehicle is stopped or starts moving and the change 22 in the internal resistance R relative to the charging rate SOC when the vehicle is moving. The internal resistance R is determined based on the change selected in accordance with the charge/discharge state of the secondary battery 1 and the internal temperature T is estimated by using the internal resistance R, whereby the internal temperature T can be estimated with accuracy. In addition, the internal resistance R can be estimated based on the charge/discharge current i of the secondary battery 1 without using the interterminal voltage V of the secondary battery 1 when the vehicle is moving, which would be measured with a large variation, a highly accurate estimation of the internal temperature T is possible. Further, in a case where the charging rate SOC is within the middle region (the predetermined range), the change selected during the previous repetition is still used or the first change 21 is selected irrespective of whether or not the secondary battery 1 is being discharged to determine the internal resistance R and the internal temperature T is estimated based on that internal resistance R, which enables simplifying the estimation process without impairing the accuracy of estimation of the internal temperature T, and reducing the processing load on the processor. Further, the internal resistance R is corrected based on the internal temperature T estimated during the previous repetition and the new internal temperature (T) is determined based on that internal resistance R, which enables preventing the estimation result from being discontinuous with the previous one to avoid a sudden change in estimated internal temperature.

Figure 6:
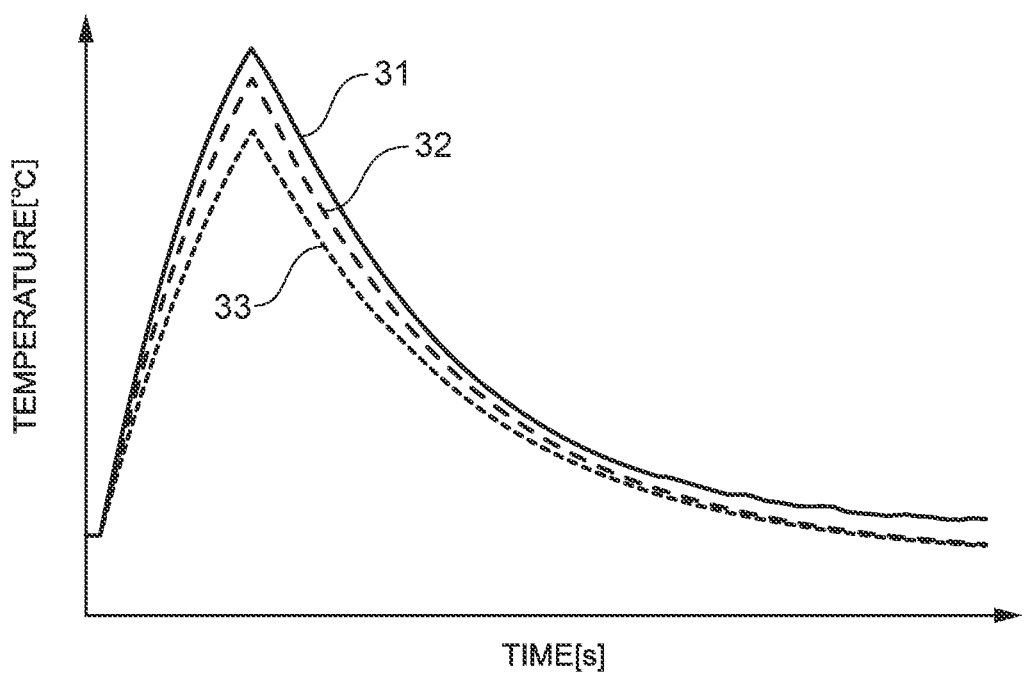
FIG. 6 is a diagram illustrating an effect of the present invention.

FIG. 6 is a diagram illustrating a temporal change in internal temperature of the secondary battery 1 resulting from generating Joule heat by charge/discharge to raise the internal temperature of the secondary battery 1 and then stopping charge/discharge to let the internal temperature decrease. An abscissa axis represents time and an ordinate axis represents the internal temperature. A line 31 represents a result of actual measurement of the internal temperature of the secondary battery 1, a line 32 represents an internal temperature estimated by the internal temperature estimation device 10 with the two changes 21, 22 used, and a line 33 represents an internal temperature estimated with only one change (in FIG. 6, only the change 22 in the internal resistance relative to the charging rate measured during charge) used as in a conventional manner. As is obvious from the figure, it is found that the internal temperature 32 estimated by using the two changes 21, 22 as in the present invention can provide an estimated value closer to the actually measured temperature 31 than the internal temperature 33 estimated by a conventional internal temperature estimation method.

Hereinabove, description is made on a method, a device, and a program for estimating an internal temperature of a secondary battery and a recording medium in which the program is stored according to the present invention; however, the present invention is not limited to the above-described embodiment and includes any aspects within the scope of the concept and claims of the present invention. For example, the estimation of the charging rate SOC (Steps 53, 56, 64) may be performed by any other method instead of the method including integrating the charge/discharge current to perform estimation as described in the above-described embodiment.

What is claimed is:

1. A method of estimating an internal temperature of a secondary battery for a vehicle,
   the method comprising a change determination process to be repeatedly performed and an internal temperature estimation process to be repeatedly performed,
   the change determination process including the steps of:
      determining a first change in internal resistance relative to a charging rate of the secondary battery based on a voltage and a charge/discharge current of the secondary battery when the vehicle is stopped or starts moving; and
      determining a second change in internal resistance relative to the charging rate of the secondary battery based on the voltage and the charge/discharge current of the secondary battery when the vehicle is moving,
   the internal temperature estimation process including the steps of:
      measuring an external temperature of the secondary battery;

measuring the charge/discharge current of the secondary battery;

determining the charging rate of the secondary battery;

determining whether or not the secondary battery is being discharged;

selecting the first change in a case where the secondary battery is being discharged;

selecting the second change in a case where the secondary battery is not being discharged;

determining an internal resistance of the secondary battery based on the selected change and the determined charging rate; and estimating the internal temperature of the secondary battery based on the external temperature, the measured charge/discharge current, and the internal resistance.

2. The method according to claim 1, further comprising the steps of:

determining whether or not the determined charging rate falls within a predetermined range, determining the internal resistance including determining, in response to the determined charging rate falling within the predetermined range, the internal resistance of the secondary battery based on the selected change and the determined charging rate determined during a previous repetition.

3. The method according to claim 1, further comprising the steps of:

determining whether or not the determined charging rate falls within a predetermined range; and selecting, in response to the determined charging rate falling within the predetermined range, the first change irrespective of whether or not the secondary battery is being discharged.

4. The method according to claim 1, further comprising the step of:

correcting the determined internal resistance based on the internal temperature estimated during a previous repetition.

5. A device that estimates an internal temperature of a secondary battery for a vehicle, the device comprising:

a voltage sensor configured to measure a voltage of the secondary battery;

a current sensor configured to measure a charge/discharge current of the secondary battery;

a temperature sensor configured to measure an external temperature of the secondary battery;

a storage configured to store a first change in internal resistance relative to a charging rate of the secondary battery when the vehicle is stopped or starts moving and a second change in internal resistance relative to the charging rate of the secondary battery when the vehicle is moving; and a controller configured to be able to communicate with the voltage sensor, the current sensor, the temperature sensor, and the storage, the controller being configured to repeatedly perform a change determination process and an internal temperature estimation process, the change determination process including:

determining the first change based on the voltage and the charge/discharge current of the secondary battery when the vehicle is stopped or starts moving; and determining the second change based on the voltage and the charge/discharge current of the secondary battery when the vehicle is moving, the internal temperature estimation process including:

acquiring the external temperature of the secondary battery measured by the temperature sensor;

acquiring the charge/discharge current of the secondary battery measured by the current sensor;

determining the charging rate of the secondary battery;

determining whether or not the secondary battery is being discharged;

selecting the first change in a case where the secondary battery is being discharged;

selecting the second change in a case where the secondary battery is not being discharged;

determining an internal resistance of the secondary battery based on the selected change and the charging rate; and estimating the internal temperature of the secondary battery based on the external temperature, the measured charge/discharge current, and the internal resistance.

* * * * *